United States Patent
Joshi et al.

(10) Patent No.: US 7,675,104 B2
(45) Date of Patent: Mar. 9, 2010

(54) INTEGRATED CIRCUIT MEMORY SYSTEM EMPLOYING SILICON RICH LAYERS

(75) Inventors: Amol Ramesh Joshi, Sunnyvale, CA (US); Harpreet Sachar, San Jose, CA (US); YouSeok Suh, Cupertino, CA (US); Shenqing Fang, Fremont, CA (US); Chih-Yuh Yang, San Jose, CA (US); Lovejeet Singh, Sunnyvale, CA (US); David H. Matsumoto, San Jose, CA (US); Hidehiko Shiraiwa, San Jose, CA (US); Kuo-Tung Chang, Saratoga, CA (US); Scott A. Bell, San Jose, CA (US); Allison Holbrook, San Jose, CA (US); Satoshi Torii, Mie (JP)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 521 days.

(21) Appl. No.: 11/461,131

(22) Filed: Jul. 31, 2006

(65) Prior Publication Data
US 2008/0023751 A1    Jan. 31, 2008

(51) Int. Cl.
*H01L 21/8247* (2006.01)
(52) U.S. Cl. .............................. 257/314; 257/E21.545
(58) Field of Classification Search .............. 257/314, 257/E21.545
See application file for complete search history.

(56) References Cited
U.S. PATENT DOCUMENTS

| | | | |
|---|---|---|---|
| 6,403,421 B1 | 6/2002 | Ikeda et al. | |
| 6,709,928 B1 | 3/2004 | Jenne et al. | |
| 6,750,157 B1* | 6/2004 | Fastow et al. | 438/786 |
| 7,303,964 B2* | 12/2007 | Shiraiwa et al. | 438/294 |
| 2002/0033501 A1 | 3/2002 | Sakagami et al. | |
| 2002/0130350 A1* | 9/2002 | Shin et al. | 257/314 |
| 2002/0149081 A1 | 10/2002 | Goda et al. | |
| 2002/0195645 A1* | 12/2002 | Takada et al. | 257/314 |
| 2004/0041208 A1* | 3/2004 | Bhattacharyya | 257/347 |
| 2005/0237777 A1 | 10/2005 | Hsieh et al. | |
| 2006/0141706 A1 | 6/2006 | Hong | |

FOREIGN PATENT DOCUMENTS

WO    2006/030380    3/2006

OTHER PUBLICATIONS

C. Park, S. Sim, J. Han, et al., "A 70nm NOR flash technology with 0.049 um2 cell size," Digest of Technical Papers, Jun. 2004, 2004 Symposium on VLSI Technology, pp. 238-239.
W. H. Kwon, J. I. Han, B. Kim, et al. "Highly Reliable 256Mb NOR Flash MLC with Self-Aligned Process and Controlled Edge Profile," Extended Abstracts of the 2005 International Conference on Solid State Devices and Materials, Kobe, 2005, pp. 448-449.

* cited by examiner

*Primary Examiner*—Jerome Jackson, Jr.
*Assistant Examiner*—Paul A Budd
(74) *Attorney, Agent, or Firm*—Farjami & Farjami LLP

(57) ABSTRACT

An integrated circuit memory system that includes: providing a substrate; forming a silicon rich charge storage layer over the substrate; forming a first isolation trench through the silicon rich charge storage layer in a first direction; and forming a second isolation trench through the silicon rich charge storage layer in a second direction.

10 Claims, 5 Drawing Sheets

INTEGRATED CIRCUIT MEMORY SYSTEM EMPLOYING SILICON RICH LAYERS

TECHNICAL FIELD

The present invention relates generally to integrated circuits, and more particularly to an integrated circuit memory system.

BACKGROUND ART

Integrated circuit (IC) products can be found in most electronic devices throughout the world. The most familiar applications of IC products are found in cellphones, camcorders, portable music players, televisions, and computers. Almost all of these product types employ some form of memory, whether as read-only memory (ROM), or random-access memory (RAM). ROM and RAM can also be classified as nonvolatile and volatile memory, respectively. Volatile memory is a semiconductor device that allows data to be stored and changed as desired; data in the volatile memory is lost when the power is turned off. Nonvolatile memory is a semiconductor device designed to store digital data in the form of an electrical charge, wherein the charge remains in storage even after the power is turned off.

Flash memory is a type of nonvolatile memory that can be erased and reprogrammed many times. Flash memory is usually constructed by one of two technologies, NOR-type or NAND-type. The names NOR (not OR) and NAND (not AND) refer to the type of logical functions used to program information within memory cells. Recently, NAND-type technology is considered to be a promising solution for not only nonvolatile stand alone memory, but also embedded memory due to its numerous aspects, such as, excellent scalability, low power consumption, process simplicity, and logic process compatibility.

The NAND-type flash memory array is formed by interconnecting flash memory cells in series with common-source/drain diffusion regions. The density of a NAND-type flash memory array is high, however the read speed is slow due to the series resistance of the configuration. Moreover, a NAND-type flash memory cell is programmed by Fowler-Nordheim tunneling, which characteristically displays a relatively slow programming speed.

Thus, a need still remains for a nonvolatile memory device with excellent scalability and low power consumption, that displays enhanced programming speed capacity. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit memory system that includes: providing a substrate; forming a silicon rich charge storage layer over the substrate; forming a first isolation trench through the silicon rich charge storage layer in a first direction; and forming a second isolation trench through the silicon rich charge storage layer in a second direction.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
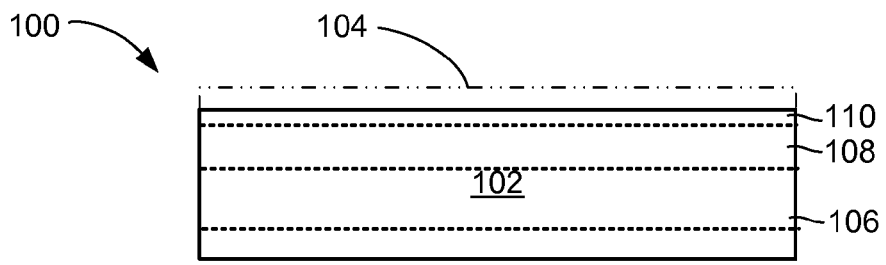
FIG. 1 is a side view of an integrated circuit memory system in an initial stage of manufacture in accordance with an embodiment of the present invention.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of a substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" is defined as one element being over and in contact with another. The term "processing" as used herein includes deposition of material or photoresist, patterning, exposure, development, etching, cleaning, and/or removal of the material or photoresist as required in forming a described structure.

Semiconductor nonvolatile memory devices, such as NAND-type, can be constructed using oxide/nitride/oxide (ONO) and oxide/nitride/oxide/nitride (ONON) configurations. The nitride layer (e.g.—silicon nitride) closest to the semiconductor substrate in an ONO or ONON configuration acts as the charge storing layer and is typically programmed and erased by the tunneling of electrons into and out of this layer.

Due to series resistances associated with NAND-type configurations and the inherently time-consuming nature of Fowler-Nordheim tunneling, NAND-type nonvolatile memory devices display comparably slow program and erase times. Consequently, the electronics industry has had to seek solutions to these problems. One such solution proposed by the present inventors, is the use of a silicon rich charge storage layer. Silicon rich charge storage layers are more attractive because of their increased conductivity when compared to regular silicon nitride layers.

In one embodiment of the present invention such a silicon rich charge storage layer is in a NAND-type nonvolatile memory device. The inventors have found that by isolating the silicon rich charge storage layer in a wordline direction by etching and in a bitline direction through a self-aligned shallow trench isolation (SASTI) process, the silicon rich charge storage layer can be better aligned with the source/drain regions. By enhancing the alignment of the silicon rich charge storage layer with the source/drain regions, the overall cell area can be reduced and the cell density can be increased as well.

It is to be understood that the following FIGS. depict an exemplary process flow for the formation of an integrated circuit memory system, such as a NAND-type nonvolatile memory device employing a silicon rich charge storage layer.

Referring now to FIG. 1, therein is shown a side view of an integrated circuit memory system 100 in an initial stage of manufacture in accordance with an embodiment of the present invention. The integrated circuit memory system 100 includes a substrate 102. The substrate 102 can be fabricated from silicon, silicon based composites, or other known semiconductor materials, which are compatible chemically, thermally, and mechanically with the process conditions chosen for the integrated circuit memory system 100.

In processing the substrate 102, a barrier oxide 104 (shown in phantom outline) is formed (e.g.—by growth or deposition) over the substrate 102, and implants made of a well implant 106, a bitline implant 108, and a threshold voltage implant 110.

After implantation, the barrier oxide 104 is removed and activation anneals are performed to repair crystalline damage and to electrically activate dopants as needed.

Figure 2:
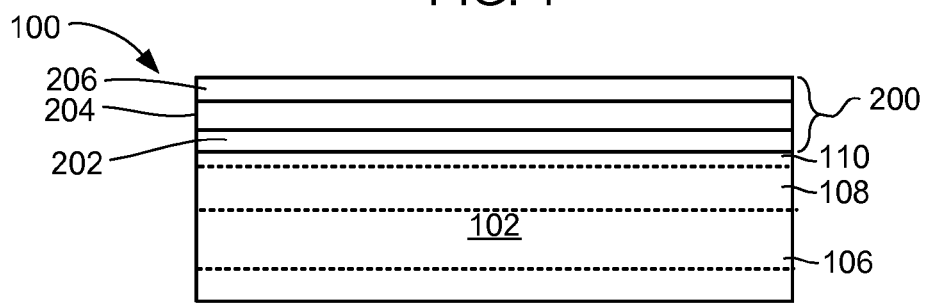
FIG. 2 is the structure of FIG. 1 after the formation of a silicon rich composite stack.

Referring now to FIG. 2, therein is shown the structure of FIG. 1 after the formation of a silicon rich composite stack 200. The silicon rich composite stack 200 is formed over the substrate 102, which includes the well implant 106, the bitline implant 108, and the threshold voltage implant 110. The silicon rich composite stack 200 may include a bottom dielectric layer 202, a silicon rich charge storage layer 204, and a top dielectric layer 206. The bottom dielectric layer 202 and the top dielectric layer 206 may include oxides formed by growth or deposition.

As an exemplary illustration, it has been discovered that optimal performance is realized when the bottom dielectric layer 202 is formed to a thickness of about 30 to 80 angstroms, the silicon rich charge storage layer 204 is formed to a thickness of about 40 to 150 angstroms, and the top dielectric layer 206 is formed to a thickness of about 30 to 80 angstroms. However, it is to be understood that the present invention is not limited to such dimensions but is only to be limited by the critical dimension technology of a functioning nonvolatile memory device.

The charge storage ability of the silicon rich composite stack 200 is provided by the silicon rich charge storage layer 204. By way of example, the silicon rich charge storage layer 204 includes a silicon rich dielectric, such as a silicon-rich-nitride (SiRN) or silicon-rich-oxynitride. Additionally, the present invention may moreover include the addition of silicon nitride, silicon rich nitride, or polysilicon layers to the silicon rich charge storage layer 204, as may be needed, to optimize erase/program performance. However, the present invention is not to be limited to these layers, it is to be understood that the silicon rich charge storage layer 204 may include any charge storage layer wherein the silicon content is greater than the amount typically stoichiometrically present.

Additionally, it is to be understood that the present invention includes other variations of the silicon rich composite stack 200, such as an additional nitride layer (e.g.—thereby forming a ONON configuration) or high dielectric constant material formed over the top dielectric layer 206.

It has been discovered that the silicon rich charge storage layer 204 has especially good memory retention characteristics when the silicon-rich-nitride has an atomic ratio of silicon to nitrogen that is greater than 3:4 (with 3:4 being the ratio stoichiometrically present in $Si_3N_4$).

After the silicon rich composite stack 200 is formed over the substrate 102, the silicon rich composite stack 200 is removed from the periphery regions of the integrated circuit memory system 100 and appropriate gate dielectrics are formed for non-memory cell integrated circuits.

Figure 3:
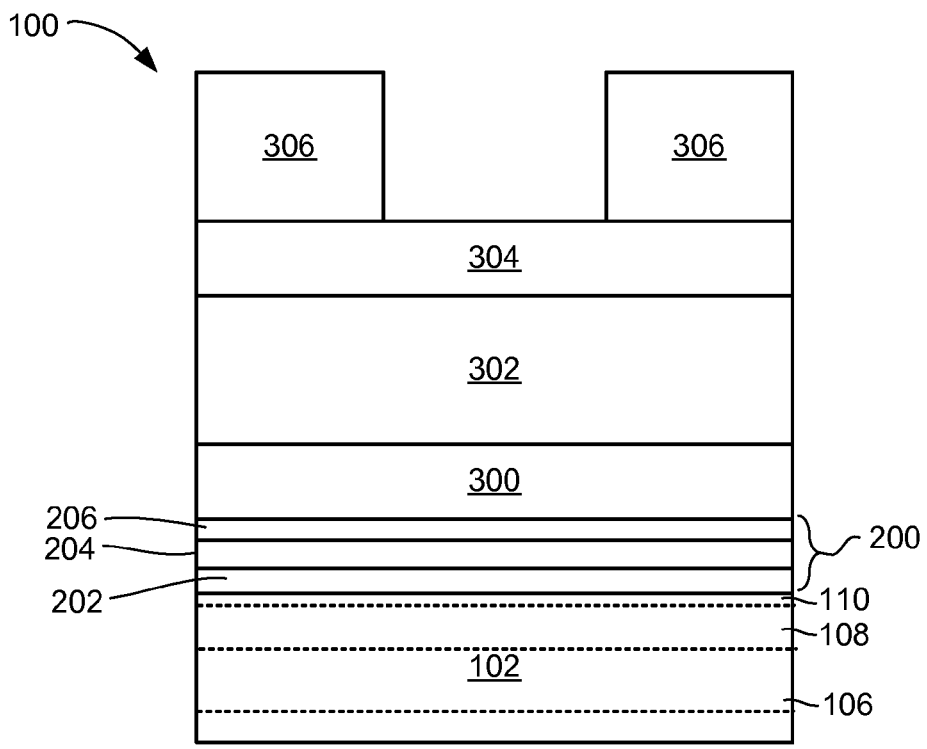
FIG. 3 is the structure of FIG. 2 after the formation of additional layers over the silicon rich composite stack.

Referring now to FIG. 3, therein is shown the structure of FIG. 2 after the formation of additional layers over the silicon rich composite stack 200. The integrated circuit memory system 100 includes the substrate 102, the silicon rich composite stack 200, a first hardmask layer 300, a second hardmask layer 302, a first anti-reflective coating (ARC) 304, and a first photoresist 306. The substrate 102 includes the well implant 106, the bitline implant 108, and the threshold voltage implant 110, and the silicon rich composite stack 200 includes the bottom dielectric layer 202, the silicon rich charge storage layer 204, and the top dielectric layer 206.

The first hardmask layer 300 may include a thin poly or polyamorphous silicon formed to a thickness of about 100 to 1,000 angstroms. The first hardmask layer 300 is formed over the silicon rich composite stack 200, as well as, the periphery gate dielectrics. The first hardmask layer 300 as a poly 1 can be formed into transistor gates.

The second hardmask layer 302 should be a durable masking material, which protects active regions within the integrated circuit memory system 100 from subsequent shallow trench isolation processes. Additionally, the second hardmask layer 302 should serve as a polish-stop material during any later step employing chemical-mechanical planarization steps. More specifically, the second hardmask layer 302 may include dielectrics, such as silicon nitride or silicon-rich-nitride. The second hardmask layer 302 is formed over the first hardmask layer 300.

The first anti-reflective coating 304 is formed over the second hardmask layer 302, and includes organic and inorganic materials, such as amorphous carbon and silicon oxynitride, for example. The first photoresist 306 is formed over the first anti-reflective coating 304 and includes negative resists, positive resists, and chemically amplified resists. The first photoresist 306 is then patterned for shallow trench etching.

Figure 4:
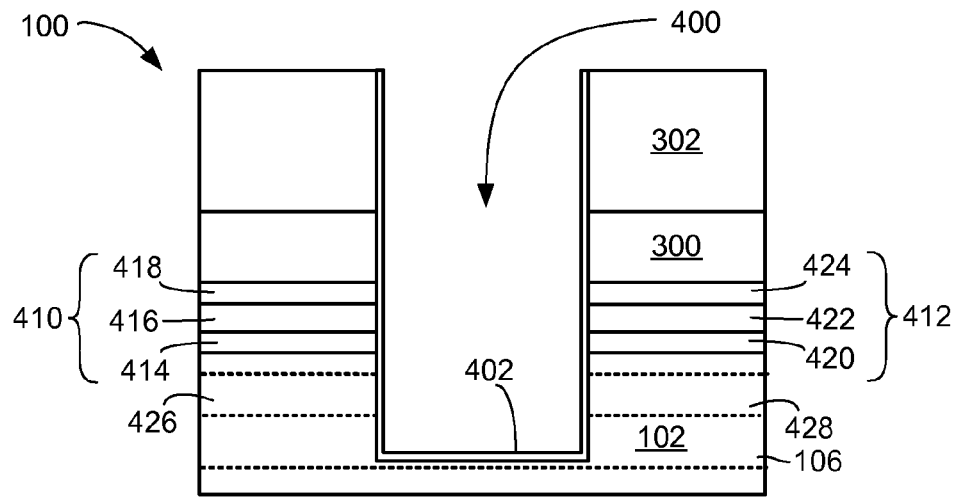
FIG. 4 is the structure of FIG. 3 after the formation of a first isolation trench.

Referring now to FIG. 4, therein is shown the structure of FIG. 3 after the formation of a first isolation trench 400. The first isolation trench 400 can be formed by a process such as shallow-trench-isolation etching into the substrate 102. The etch process removes selected portions of the second hardmask layer 302, the first hardmask layer 300, the silicon rich composite stack 200, of FIG. 3, and the substrate 102. Memory regions 410 and 412 may include the bottom dielectric layers 414 and 420, the silicon rich charge storage layers 416 and 422, and the top dielectric layers 418 and 424.

The etching process continues within the substrate 102 until the required depth has been achieved to isolate portions of the threshold implant 110, of FIG. 1, and the bitline implant 108, of FIG. 1. By way of example, the etching process may terminate within the well implant 106. The etching may be done either simultaneously or separately in core and periphery regions, depending on the depth of the first isolation trench 400 depth isolation profile requirements. The etching techniques used to form the first isolation trench 400 are well known in the art and not repeated here.

Additionally, before filling the first isolation trench 400 a trench liner 402, such as an oxide, may be optionally formed to improve the interface between the substrate 102 and any material used to fill the first isolation trench 400.

The formation of the first isolation trench 400 separates the silicon rich composite stack into memory regions 410 and 412, which extend into the page of FIG. 4. The memory region 410 includes the bottom dielectric layer 414, the silicon rich charge storage layer 416, and the top dielectric layer 418. The memory region 412 includes the bottom dielectric layer 420, the silicon rich charge storage layer 422, and the top dielectric layer 424. The first isolation trench 400 must be sufficiently deep to remove portions of the threshold adjustment implant 110 and the bitline implant 108 to form bitlines 426 and 428.

The use of the first isolation trench 400 allows the memory regions 410 and 412, and the bitlines 426 and 428, to be self-aligned in what can be called a self-aligned shallow trench isolation (SASTI) process. This enhanced alignment of the silicon rich charge storage layers 416 and 422 helps reduce the overall area of the integrated circuit memory system 100. By reducing the overall area of the integrated circuit memory system 100, the cell size is reduced so the density of the integrated circuit memory system 100 is increased.

After formation of the memory regions 410 and 412, the first photoresist 306, of FIG. 3, and the first anti-reflective coating 304, of FIG. 3, are removed, and a cleaning process is used which removes contaminants from the surface of the integrated circuit memory system 100. The integrated circuit memory system 100 may then be inspected to verify proper measurements, such as step height, etch rate and critical dimensions.

Figure 5:
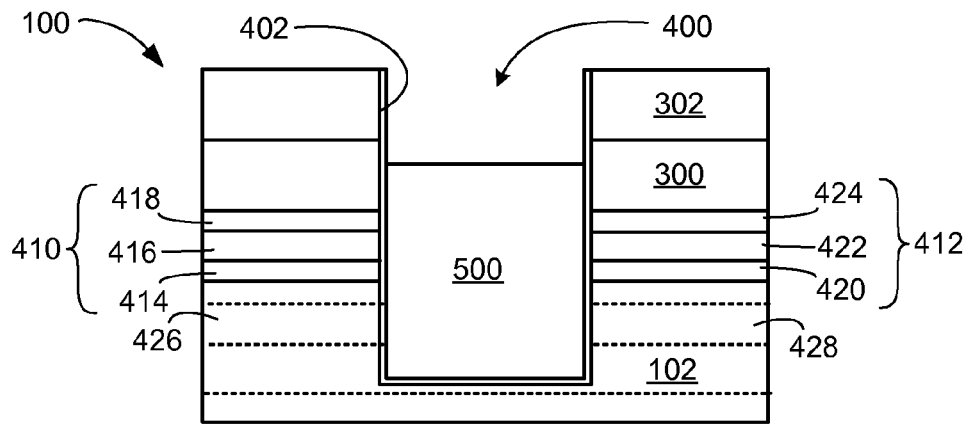
FIG. 5 is the structure of FIG. 4 during filling of the first isolation trench.

Referring now to FIG. 5, therein is shown the structure of FIG. 4 during filling of the first isolation trench 400. The integrated circuit memory system 100 includes the substrate 102, the first isolation trench 400, the trench liner 402, the memory regions 410 and 412, the bottom dielectric layers 414 and 420, the silicon rich charge storage layers 416 and 422, the top dielectric layers 418 and 424, the bitlines 426 and 428 and a trench fill material 500.

The first isolation trench 400 is filled with the trench fill material 500, which helps to isolate the silicon rich charge storage layers 416 and 422 in the bitline direction. By way of example, the trench fill material 500 may include an insulator material such as an oxide formed by a high density plasma process. Initially, the trench fill material 500 is polished stopping somewhere in the second hardmask layer 302 so that first hardmask layer 300 is not exposed. In a subsequent step, the trench fill material 500 is etched by a process such as hydrogen fluoride dipping to have the surface of the trench fill material 500 in the middle of the first hardmask layer 300.

Figure 6:
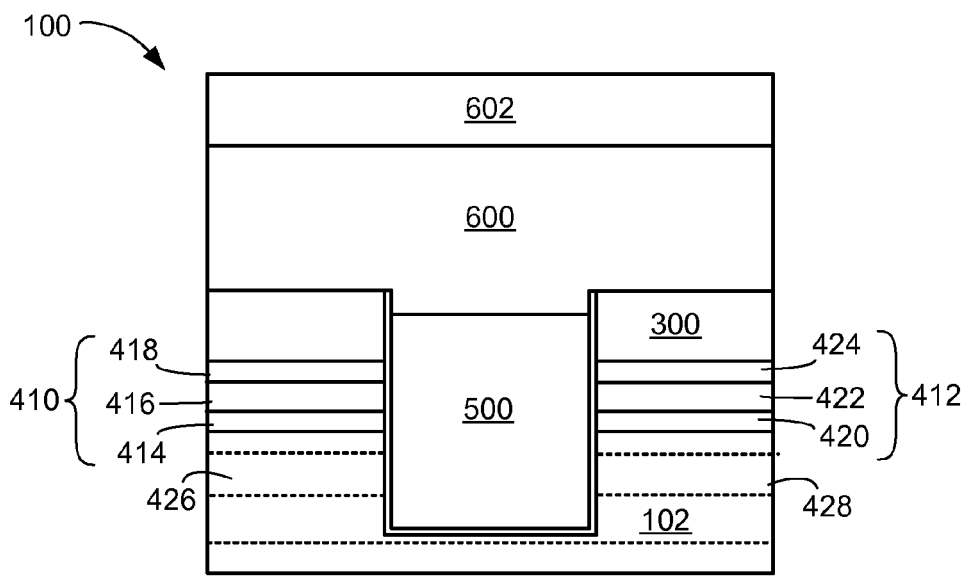
FIG. 6 is the structure of FIG. 5 after the formation of a conductive layer and a third hardmask layer.

Referring now to FIG. 6, therein is shown the structure of FIG. 5 after the formation of a conductive layer 600 and a third hardmask layer 602. Before formation of the conductive layer 600 and the third hardmask layer 602, remaining portions of the second hardmask layer 302, of FIG. 5, are removed from over the integrated circuit memory system 100. The integrated circuit memory system 100 includes the substrate 102, the first hardmask layer 300, the memory regions 410 and 412, the bottom dielectric layers 414 and 420, the silicon rich charge storage layers 416 and 422, the top dielectric layers 418 and 424, the bitlines 426 and 428, the trench fill material 500, the conductive layer 600 and the third hardmask layer 602.

The conductive layer 600 can be fabricated from material, such as polysilicon, and the third hardmask layer 602 can be fabricated from material, such as an oxide. However, it is to be understood that the conductive layer 600 and the third hardmask layer 602 can be fabricated from any conductive materials and from any hardmask materials, respectively, as are compatible with the fabrication process of the integrated circuit memory system 100.

Figure 7:
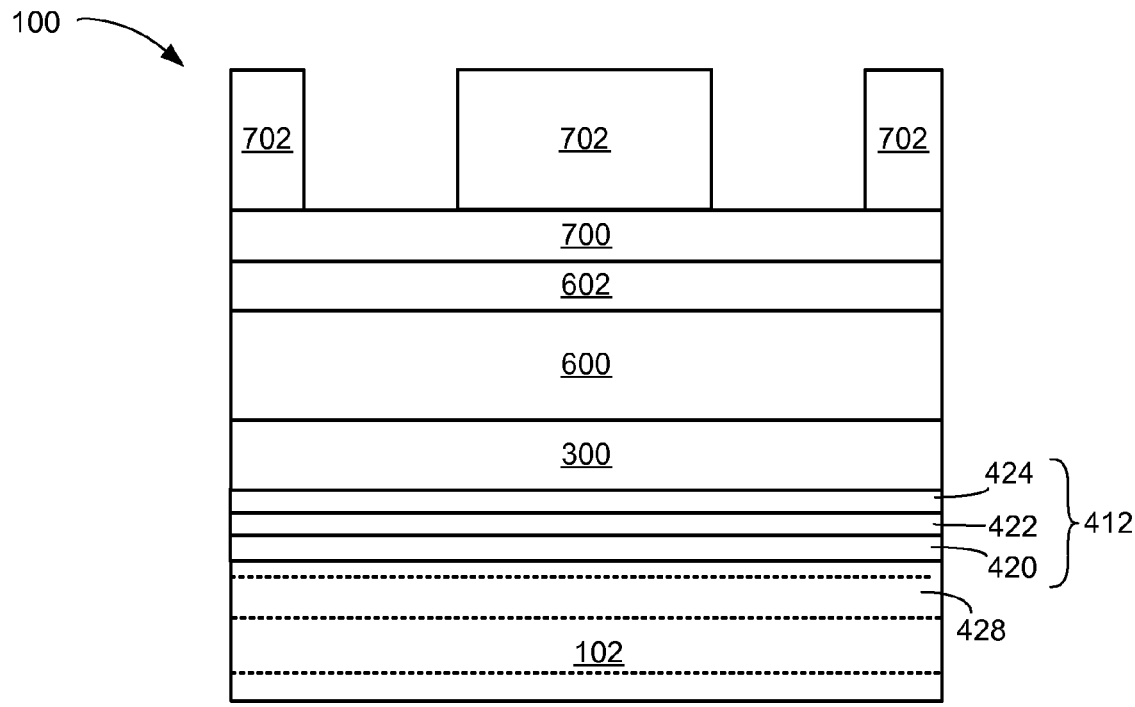
FIG. 7 is the structure of FIG. 6 from a different side view after the formation of a second anti-reflective coating and a second photoresist.

Referring now to FIG. 7, therein is shown the structure of FIG. 6 from a different side view after the formation of a second anti-reflective coating 700 and a second photoresist 702. The integrated circuit memory system 100 includes the substrate 102, the silicon rich composite stack 200, the first hardmask layer 300, the memory region 412, the bottom dielectric layer 420, the silicon rich charge storage layer 422, the top dielectric layer 424, the bitline 428, the conductive layer 600, the third hardmask layer 602, the second anti-reflective coating 700 and the second photoresist 702. The second anti-reflective coating 700 is formed over the third hardmask layer 602, and includes organic and inorganic materials. The second photoresist 702 is formed over the second anti-reflective coating 700 and includes negative resists, positive resists, and chemically amplified resists. The second photoresist 702 is then patterned for etching wordlines.

Figure 8:
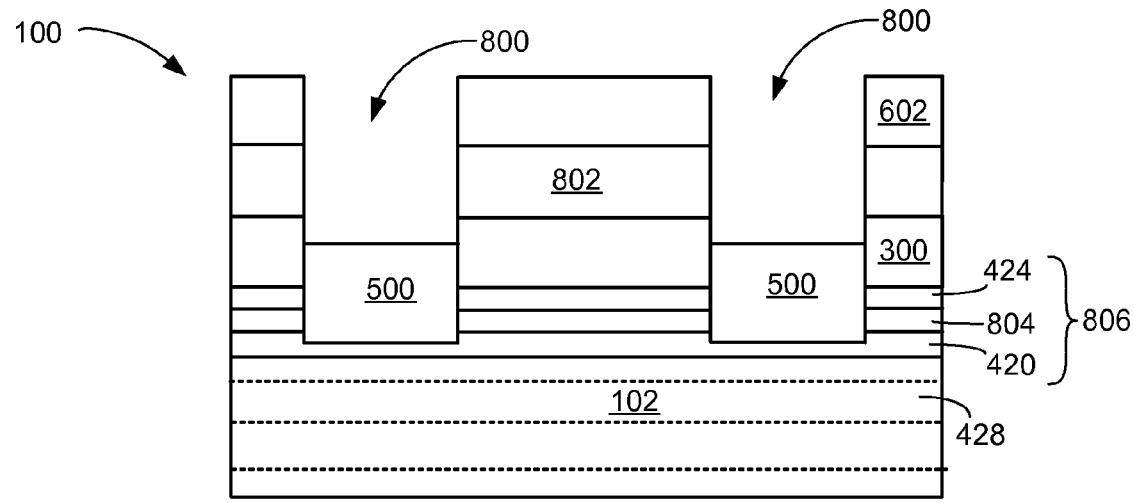
FIG. 8 is the structure of FIG. 7 after the formation of an isolation trench.

Referring now to FIG. 8, therein is shown the structure of FIG. 7 after the formation of a second isolation trench 800. The second isolation trench 800 is formed by an etch process that removes selected portions of the third hardmask layer 602, the conductive layer 600, of FIG. 7, the first hardmask layer 300, the top dielectric layer 424, the silicon rich charge storage layer 422, of FIG. 7, and the bottom dielectric layer 420.

The etching process terminates within the bottom dielectric layer 420. By etching the conductive layer 600, the conductive layer 600 is separated into isolated conductive layers 802, such as wordlines, which extend into the page of FIG. 8. By contrast, the bitline 428 within the substrate 102, extends across the page of FIG. 8 along the length of the integrated circuit memory system 100.

Furthermore, by removing the silicon rich charge storage layer 422 in a second direction, such as a wordline direction, the silicon rich charge storage layer 422 is fully isolated to form isolated silicon rich charge storage layers 804. This structure 806 is a functioning stack for a nonvolatile memory device, such as a NAND-type device.

The etching technique used to form the second isolation trench 800 is etch selective to not etch the trench fill material 500. The second isolation trench 800 is subsequently filled with dielectric material, which is not shown for clarity.

Figure 9:
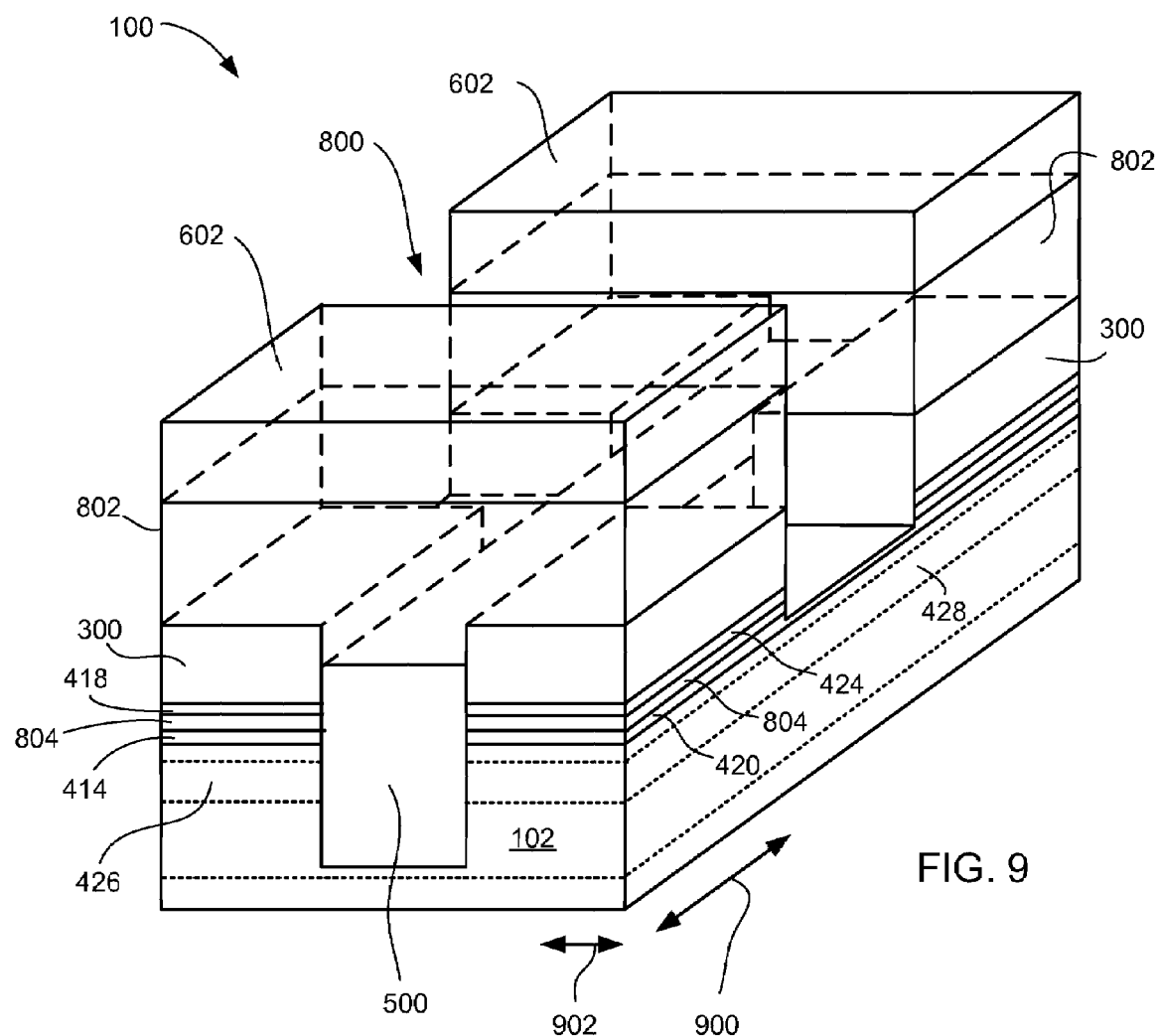
FIG. 9 is an isometric view of the integrated circuit system in accordance with an embodiment of the present invention.

Referring now to FIG. 9, therein is shown an isometric view of the integrated circuit memory system 100 in accordance with an embodiment of the present invention. The integrated circuit memory system 100 includes the substrate 102, the bitlines 426 and 428, the bottom dielectric layers 414 and 420, the isolated silicon rich charge storage layers 804, the top dielectric layers 418 and 424, the first hardmask layer 300, the trench fill material 500, the isolated conductive layers 802, the third hardmask layer 602, and the second isolation trench 800. Notably, the isolated silicon rich charge storage layers 804 are fully isolated in a first direction 900, such as a bitline direction, and in a second direction 902, such as a wordline direction.

Figure 10:
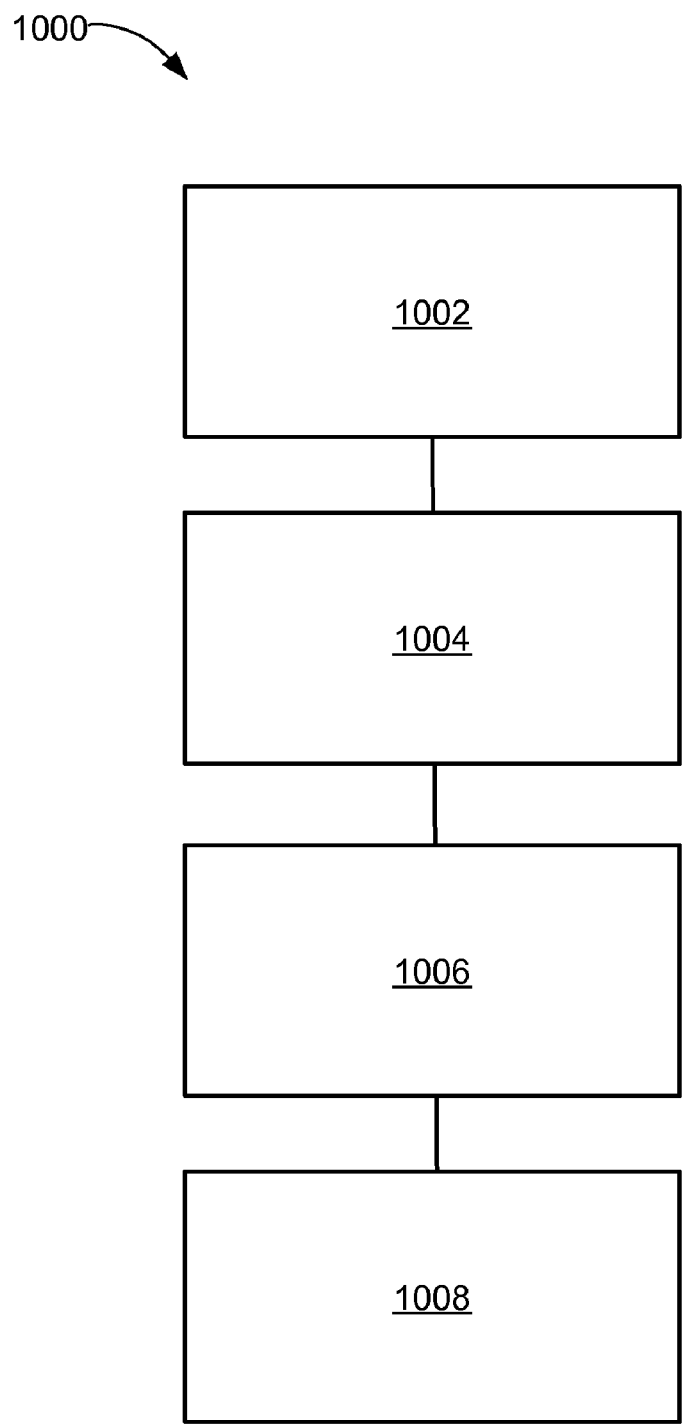
FIG. 10 is a flow chart for an integrated circuit memory system for fabricating the integrated circuit memory system in accordance with an embodiment of the present invention

Referring now to FIG. 10, therein is shown a flow chart for an integrated circuit memory system 1000 for fabricating the integrated circuit memory system 100 in accordance with an embodiment of the present invention. The integrated circuit memory system 1000 includes: providing a substrate in a block 1002; forming a silicon rich charge storage layer over the substrate in a block 1004; forming a first isolation trench through the silicon rich charge storage layer in a first direction in a block 1006; and forming a second isolation trench through the silicon rich charge storage layer in a second direction in a block 1008.

It has been discovered that the present invention thus has numerous aspects. A principle aspect is that the present invention allows the memory regions and the bitlines to be self-aligned in what can be called a self-aligned shallow trench isolation (SASTI) process. This enhanced alignment of the silicon rich charge storage layers helps reduce the overall area of the integrated circuit memory system.

Another aspect of the present invention is the enhanced electrical conductivity of the silicon rich charge storage layer. This aspect helps to decrease the amount of time necessary to program and erase the integrated circuit memory system.

Yet still, another aspect of the present invention is that the self-aligned shallow-trench-isolation method is a simple manufacturing process that improves fabrication accuracy and precision, thereby advancing device reliability.

These and other valuable aspects of the present invention consequently further the state of the technology to at least the next level.

Thus, it has been discovered that the integrated circuit memory system of the present invention furnishes important and heretofore unknown and unavailable solutions, capabilities, and functional aspects. For instance, the integrated circuit memory system of the present invention enhances charge storage layer alignment with source/drain regions, decreases program and erase times, and simplifies the manufacturing process. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit memory system comprising:
a substrate; and
a silicon rich charge storage layer over the substrate having a first isolation trench through the silicon rich charge storage layer in a first direction and a second isolation trench through the silicon rich charge storage layer in a second direction;
said silicon rich charge storage layer comprising silicon rich nitride having an atomic ratio of silicon to nitrogen that is greater than 3:4.

2. The system as claimed in claim 1 further comprising:
a top dielectric layer over the silicon rich charge storage layer; and
a bottom dielectric layer under the silicon rich charge storage layer and on the substrate.

3. The system as claimed in claim 1 wherein:
the silicon rich charge storage layer includes a layer of said silicon rich nitride with a thickness under 150 angstroms.

4. The system as claimed in claim 1 further comprising:
a trench fill material that fills the first isolation trench above the level of the silicon rich charge storage layer.

5. The system as claimed in claim 1 further comprising:
a trench fill material that fills the first isolation trench below the level of a first hardmask layer.

6. An integrated circuit memory system comprising:
a substrate having a bitline implant;
a silicon rich charge storage layer over the substrate, said silicon rich charge storage layer comprising silicon rich nitride having an atomic ratio of silicon to nitrogen that is greater than 3:4;
a first hardmask layer over the silicon rich charge storage layer;
a second hardmask layer over the first hardmask layer having a first isolation trench through the second hardmask layer, the first hardmask layer, the silicon rich charge storage layer, the substrate, and the bitline implant in a first direction to form a bitline;
a trench fill material in the first isolation trench; and
a conductive layer over the trench fill material and the first hardmask layer having a second isolation trench through the conductive layer, the first hardmask layer, and the silicon rich charge storage layer in a second direction to form a wordline.

7. The system as claimed in claim 6 further comprising:
a top dielectric layer over the silicon rich charge storage layer; and
a bottom dielectric layer on the substrate under the silicon rich charge storage layer having the second isolation trench into but not through the bottom dielectric layer.

8. The system as claimed in claim 6 wherein:
the silicon rich charge storage layer includes a layer of said silicon rich nitride with a thickness between about 40 to 150 angstroms.

9. The system as claimed in claim 6 wherein:
the trench fill material tills the first isolation trench with an insulator above the level of the silicon rich charge storage layer.

10. The system as claimed in claim 6 wherein:
the trench fill material fills the first isolation trench with an insulator below the level of the first hardmask layer.

* * * * *